United States Patent
Wilson (10) Patent No.: US 10,270,241 B2
(45) Date of Patent: Apr. 23, 2019

(54) FAULT CURRENT LIMITER HAVING FAULT CHECKING SYSTEM FOR POWER ELECTRONICS AND BYPASS CIRCUIT

(71) Applicant: Varian Semiconductor Equipment Associates, Inc., Gloucester, MA (US)

(72) Inventor: Adrian Wilson, Newcastle upon Tyne (GB)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 345 days.

(21) Appl. No.: 15/155,477

(22) Filed: May 16, 2016

(65) Prior Publication Data

US 2017/0331282 A1 Nov. 16, 2017

(51) Int. Cl.
| | |
|---|---|
| *H02H 9/00* | (2006.01) |
| *H02H 9/02* | (2006.01) |
| *G01R 31/02* | (2006.01) |
| *H02H 1/00* | (2006.01) |

(52) U.S. Cl.
CPC ............. *H02H 9/02* (2013.01); *G01R 31/024* (2013.01); *H02H 1/0007* (2013.01)

(58) Field of Classification Search
CPC ....................................................... H02H 9/02
See application file for complete search history.

(56) References Cited

U.S. PATENT DOCUMENTS

| | | | | |
|---|---|---|---|---|
| 5,892,644 | A * | 4/1999 | Evans | ...................... H01F 6/00 |
| | | | | 361/19 |
| 9,941,782 | B2 * | 4/2018 | Schuermann | ........... H02M 1/32 |
| 2013/0264883 | A1 * | 10/2013 | Bhavaraju | ............... H02J 3/383 |
| | | | | 307/80 |
| 2016/0202321 | A1 * | 7/2016 | Drame | ............... G01R 31/3277 |
| | | | | 324/424 |

\* cited by examiner

*Primary Examiner* — Stephen W Jackson (57) ABSTRACT

A fault current limiter may include a current limiting leg to transmit a first current and a control leg in parallel with the current limiting leg, the control leg to transmit a second current. The control leg may include a plurality of power electronic modules arranged in electrical series with one another, and a bypass power electronic module arranged in electrical series with the plurality of power electronic modules. The control leg may further include a plurality of current monitors arranged electrically in series with the plurality of power electronic modules and the bypass power electronic module, and at least one triggering circuit, wherein the plurality of current monitors is electrically coupled to the at least one triggering circuit, and wherein the at least one triggering circuit is coupled to at least one of: the plurality of power electronic modules, and the bypass power electronic module.

20 Claims, 4 Drawing Sheets

FIG. 4

FAULT CURRENT LIMITER HAVING FAULT CHECKING SYSTEM FOR POWER ELECTRONICS AND BYPASS CIRCUIT

FIELD

The present embodiments relate to current limiting devices and more particularly to solid state fault current limiters.

BACKGROUND

In the present day, solid state fault current limiters (SSFCL) are used to regulate current over transmission lines where transmission of currents of several thousand amps are common. SSFCL systems are designed to prevent excessive current in the event of a fault condition. In one design of an SSFCL, a mutual reactor is configured to split load current into a control leg and a limiting leg. The control leg may include power electronic switch(es) and may be designed to transmit a current well within the rating of power electronic switches, such as several hundred amps. The limiting leg may be designed to transmit several thousand amps and may be further designed with an adequate self-inductance to limit the prospective fault current to a desired safe level. Under normal conditions current flows in the control leg and the limiting leg, where the reactor is designed in this situation to have low losses. A circuit or similar component is provided to monitor the control current of the control leg, and to open the power electronic switch(es) when a current threshold (or other triggering scheme) is exceeded, so the mutual reactor becomes unbalanced, and the self-inductance of the limiting leg then reduces the current flowing in the limiting leg to a safe level.

One issue with the aforementioned design arises when solid state switches fail to short circuit. Since this circuit just opens the solid state switches on fault, any failure of the solid state switches is just evident on demand for fault protection. The fault current limiter may include a fuse to protect against solid state switch failures or other component failures. One issue with fuse design is when the total current increases, the energy used to blow the fuse in the control leg may not be adequate to protect a network from damaging first peak faults (e.g., at approximately 10 ms). Indeed, when the mutual reactor is designed to have less fault current let through than normal current (due to a high peak fault current reduction limitation, for example), the fuse protection system will not work.

With respect to these and other considerations the present disclosure is provided.

BRIEF SUMMARY

In one embodiment, a fault current limiter includes a current limiting leg to transmit a first current, and a control leg in parallel with the current limiting leg, wherein the control leg may transmit a second current. The control leg may include a plurality of power electronic modules arranged in electrical series with one another, and a bypass power electronic module arranged electrically in parallel with the plurality of power electronic modules. The control leg may further include a plurality of current monitors arranged electrically in series with the plurality of power electronic modules and the bypass power electronic module, and at least one triggering circuit, wherein the plurality of current monitors are electrically coupled to the at least one triggering circuit, and wherein the at least one triggering circuit is coupled to at least one of: the plurality of power electronic modules, and the bypass power electronic module.

In another embodiment, a fault current limiter includes a current limiting leg to transmit a first current, and a control leg in parallel with the current limiting leg, wherein the control leg may transmit a second current. The control leg may include a fault checking system having a first power electronic module and a second power electronic module arranged in electrical series with one another, and a bypass power electronic module electrically in parallel with the first power electronic module and the second power electronic module. The fault checking system may further include a plurality of current monitors arranged in electrical series with the plurality of power electronic modules and the bypass power electronic module. The fault checking system may further include a first triggering circuit in communication with the first power electronic module, a second triggering circuit in communication with the second power electronic module, and a third triggering circuit in communication with the bypass power electronic module. The fault checking system may further include a test and supervision (T/S) circuit electrically coupled to the first power electronic modules, the second power electronic module, and the bypass power electronic module, wherein the T/S circuit receives output from the plurality of current monitors for assessing operation of the first power electronic module, the second power electronic module, and the bypass power electronic module.

In yet another embodiment, a method includes providing a current limiting leg to transmit a first current, and providing a control leg in parallel with the current limiting leg, the control leg to transmit a second current, the control leg including a fault checking system. The fault checking system may include a first power electronic module and a second power electronic module arranged in electrical series with one another, a bypass power electronic module electrically in parallel with the first power electronic module and the second power electronic module, a plurality of current monitors arranged in electrical series with the plurality of power electronic modules and the bypass power electronic module, a first triggering circuit in communication with the first power electronic module, a second triggering circuit in communication with the second power electronic module, and a third triggering circuit in communication with the bypass power electronic module. The method may further include monitoring current through a bypass circuit to determine whether the bypass circuit and the bypass power electronic module are functioning properly, and monitoring current through at least one of the first power electronic module and the second power electronic module to determine whether the at least one the first power electronic module and the second power electronic module is functioning properly.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

The present embodiments involve apparatus, systems and methods for improved fault current protection. Various embodiments address issues related to failure on demand for fault protection by providing circuitry architecture and techniques to facilitate checking components of a fault current limiter including detection circuits and power electronics. Various embodiments provide a control leg of a fault current limiter including a plurality power electronic modules arranged in electrical series with one another, and a bypass power electronic module arranged electrically in parallel with the plurality of electronic modules. In various embodiments, a novel arrangement of the control leg is provided for controlling and testing the plurality of power electronic modules and the bypass power electronic module.

In some embodiments, a plurality of triggering circuits may be coupled to the plurality of power electronic module as detailed herein below. A given triggering circuit may be disposed on a dedicated triggering circuit board in some embodiments. The triggering circuit may be configured with multiple inputs to receive current signals from the plurality of current monitors, as well as a comparator circuit for comparing current signals received from the plurality of current monitors. The triggering circuit may further include a current source for testing as detailed below, as well as switches for allowing a test to be performed. Furthermore, the triggering circuit may include control logic to ensure a test is performed at a correct instance. In addition, the triggering circuit may include an input for running a self-test as well as an output for signaling a completion of a self-test. In various embodiments having multiple triggering circuits, a triggering circuit may further include a trigger input from an additional board as well as a trigger output to the additional board.

In various embodiments, a novel test and supervision circuit (hereinafter "T/S circuit") is provided in the control leg of a fault current limiter, where the T/S circuit may be configured for feedback from solid state switches during a self-test. For example, the T/S circuit may include a plurality of detectors optically coupled to the plurality of electronic modules. The T/S circuit may further include a plurality of current inputs and a plurality of comparator signal inputs coupled to comparators located on a plurality of control boards. The T/S circuit may further include a programmable test timer to control timing of a self-test. In addition, the T/S circuit may include a manual "perform test" input, as well as a run self-test output. Moreover, the T/S circuit may include an output to output the test status to an overall control system for a fault current limiter. In some embodiments, components to perform the triggering, testing and monitoring functions may be physically integrated into a single board.

Figure 1:
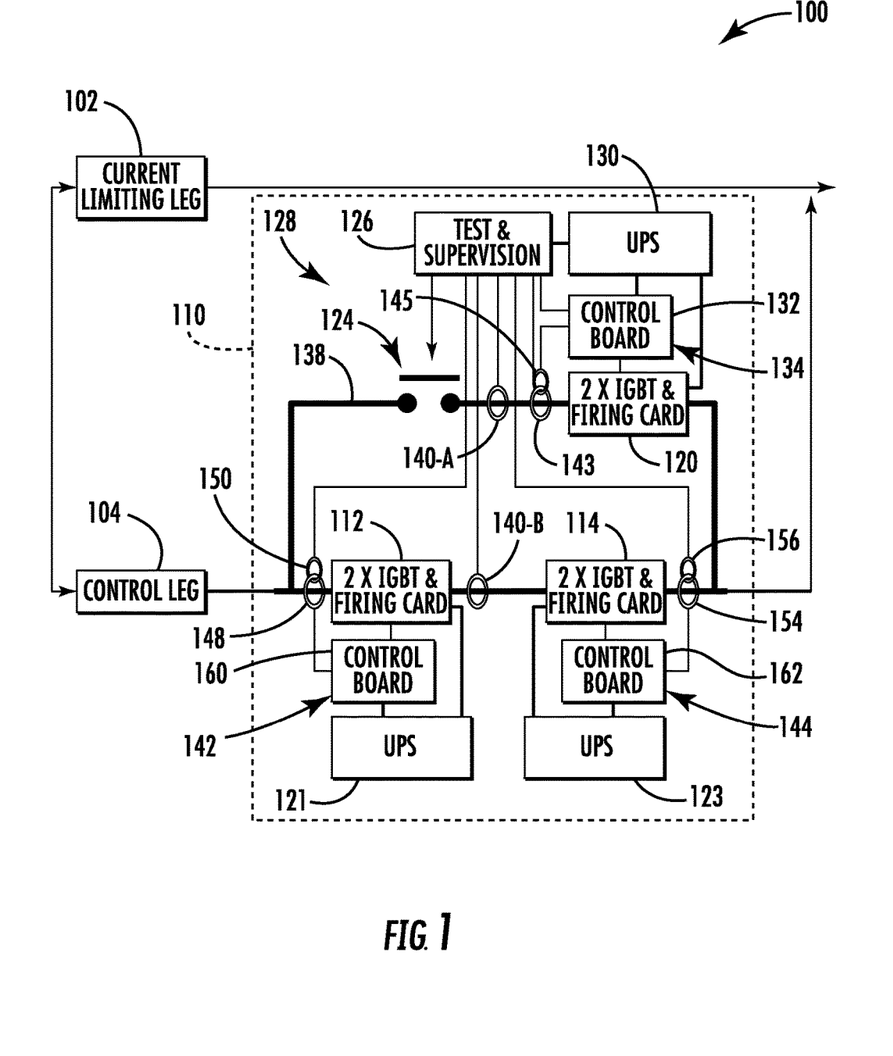
FIG. 1 presents an exemplary fault current limiter according to embodiments of the disclosure.

FIG. 1 illustrates a fault current limiter (FCL) 100 according to various embodiments of the disclosure. The FCL 100 may be used to limit current along a transmission line or other current carrying path. The FCL 100 may include a current limiting leg 102 to transmit a first current and a control leg 104 to transmit a second current, where the second current can be much lower than the first current. For example, in normal operation the first current passing through the current limiting leg 102 may be in the range of a two thousand amps, three thousand amps, or more. The control leg 104 may be configured to pass a current such as 200 A, 300 A, or similar value. The embodiments are not limited in this context.

The FCL 100 may be arranged as a solid state fault current limiter to include, in the control leg 104, one or more fault checking systems 110 arranged in electrical series with one another. In some embodiments, the fault checking system 110 may include one or more insulated gate bipolar transistors (IGBT). The embodiments are not limited in this context. Furthermore, embodiments of the disclosure are described for the sake of explanation in the context of a single fault checking circuit 110 along the control leg 104. One will appreciate in alternative embodiments, multiple fault checking systems 110 may be coupled together along the control leg 104.

As shown, the FCL 100 includes a first power electronic module (PEM) 112 and a second PEM 114 arranged electrically in series with respect to one another, and a bypass PEM 120 arranged in parallel with the first and second PEMs 112, 114. A relay or circuit breaker 124 is positioned in series with the bypass PEM 120, and a T/S circuit 126 is electrically coupled to the first and second PEMs 112, 114 and the bypass PEM 120 to monitor and check the performance of the components of the fault checking system 110, as will be described in greater detail blow. As used herein, the term "power electronic module" may refer to a solid state switch module including a solid state switch such as an IGBT and associated circuitry, including interfaces such as signal receivers, light emitting diodes (LED) and other circuitry. In some embodiments, each PEM includes two (2) IGBTs and a firing card.

In the example shown there are three (3) total PEMs, while in other embodiments a greater or fewer number of PEMs may be employed. The number of PEMs used may be based on the voltage sustained across the control leg 104 and the voltage rating of a given PEM. In cases of a voltage change of several thousand volts, the use of several PEMs in series may be appropriate because a given PEM may be able to operate at a maximum voltage across the IGBT of less magnitude than the total voltage change, for example.

As further shown, a first power supply 121 is configured to provide current to the first PEM 112 and a first triggering circuit 142, a second power supply 123 is configured to provide current to the second PEM 113 and a second triggering circuit 144, and a bypass power supply 130 is configured to provide current to the bypass PEM 120 and a third triggering circuit 134.

The T/S circuit 126 is part of a monitoring circuit 128 of the fault checking system 110. As shown, the T/S circuit 126 is electrically coupled to the bypass power supply 130 and bypass control board 132, the bypass control board 132 including the triggering circuit 134 for the bypass PEM 120. The T/S circuit 126 controls operation of the circuit breaker 124 to open or close a bypass circuit 138.

The FCL 100 may also include a plurality of current monitors 140A-B arranged in the control leg 104, for example, as shown. Alternatively, one or more current monitors may be located in the current limiting leg 102. As further shown in FIG. 1, the FCL 100 may also include a plurality of triggering circuits 134, 142 and 144, wherein the plurality of current monitors 140A-B are coupled to the triggering circuits 134, 142 and 144, and wherein the triggering circuits 134, 142 and 144 are coupled, respectively, to the bypass PEM 120, the first PEM 112, and the second PEM 114.

More specifically, as shown in FIG. 1, the current monitor 140A monitors the bypass circuit 138, and the current monitor 140B monitors the current of the first PEM 112 and the second PEM 114. One will appreciate the use of two or more current monitors may supply redundancy to current detection along the control leg 104. Furthermore, a first current transformer 143, along with injection equipment 145, is provided for the triggering circuit 134 of bypass PEM 120. As shown, the first current transformer 143 and the injection equipment 145 are electrically coupled between the T/S circuit 126 and the bypass circuit 138. A second current transformer 148 for triggering circuit 142 is linked to injection equipment 150 for the first PEM 112, and a third transformer 154 for triggering circuit 144 is linked to injection equipment 156 for the second PEM 114.

In some embodiments, one or more of the triggering circuits 134, 142, and 144 may include a threshold detector electrically coupled to a first current monitor output of current monitors 140A-B. The threshold detector may be configured to determine when current being transmitted along the control leg 104 exceeds a threshold, using current signals received from the current monitors 140A-B. In one embodiment, the triggering circuit 134 may be located on the control board 132, where the control board 132 is set at a relatively low voltage with respect to ground, while other elements of the control leg 104, such as the bypass PEM 120 are at relatively higher voltage, such as several thousand volts. Accordingly, the triggering circuit 134 may be optically coupled to the bypass PEM 120, and may be in particular configured with light emitting diodes (not shown) to communicate signals to the bypass PEM 120. Similarly, the triggering circuit 142 may be located on a control board 160, and the triggering circuit 144 may be located on a control board 162. In operation, when the current monitors 140A-B determine a current threshold has been exceeded, the threshold detector may send control signals to switch off the bypass PEM 120, the first PEM 112, and/or the second PEM 114.

While in the aforementioned embodiments, one or more of the control boards 132, 160, and/or 162 may receive a monitored current from current monitors 140A-B of the control leg 104, in additional embodiments, a resistor may be provided as part of a current monitor. In these embodiments monitored current of the control leg 104 is transformed into a voltage via the resistor and is sent to the respective control board as a voltage. In such embodiments, the current source of the control boards may be replaced by a voltage source, where a threshold detector detects when a threshold voltage is exceeded instead of current. In these embodiments a shorting switch may be omitted from the control boards. Additionally, the control board may include a rectifier to rectify the input alternating current (AC) voltage received from the current monitor. Accordingly, in normal operation, the control board may send signals to open the solid state switches of the control leg when a threshold voltage is exceeded. Moreover, in these embodiments, where current monitor shorting switches are not included, a self-test procedure may accordingly omit the closing and opening of current monitor shorting switches.

The T/S circuit 126 of the FCL 100 may be coupled to the triggering circuits 134, 142, and 144. In various embodiments, the monitoring circuit 128 may include a plurality of inputs coupled to the plurality of current monitors 140A-B. The monitoring circuit 128 may also include a programmable test timer (not shown) as well as at least one comparator input to receive a comparator signal. The comparator input (not shown) may be coupled to a comparator in each of the triggering circuits 134, 142, and 144, where the comparator is further coupled to the plurality of current monitors 140A-B.

To facilitate checking of problems or failures in power electronics or detection circuitry of the FCL 100, the fault checking system 110 may provide for self-testing of different components, while not being unduly burdensome to operation of the FCL 100. In various embodiments, a self-test may be initiated manually using a user interface such as a push button, a control room signal or other mechanism. In other embodiments a self-test signal may be generated by a timer, such as a programmable test timer, where the self-test is generated periodically, such as at a regular interval. Once a self-test signal is initiated, an instruction may be sent to a given circuit, where the circuit may reside in a control board. The control board receiving the self-test signal may then initiate the self-test.

In some embodiments, the self-test may include a test sequence beginning by performing an operation of detecting an immediate current-zero-crossing point in the control leg 104, where the zero current crossing occurs at intervals according to the frequency of alternating current passing through the FCL 100. In a subsequent operation, the next or subsequent current-zero-crossing point is detected. This may allow logic in the circuit, such as one of the triggering circuits to predict the intervals when subsequent current-zero-crossing points take place.

In some embodiments, the following test sequence may be used to determine the health of the bypass PEM 120. A first system test includes a start position including the first and second PEMs 112, 114 in a closed position as normal, passing load current. The bypass PEM 120 and the circuit breaker 124 are open in the bypass circuit 138. Next, the circuit breaker 124 is closed, and the T/S circuit 126 checks the current monitor 140-A to see if current is flowing through bypass PEM 120 in the bypass circuit 138. If the current monitor 140-A detects current, the bypass PEM 120 is determined to be functioning improperly. An error indicator/message may then be generated, and the system check may be repeated.

In a second system test, the bypass PEM 120 is closed. In this case, some current may now be flowing in the bypass circuit 138, as detected by current monitor 140-A. If no current is detected, the bypass PEM 120 has failed, as indicated by the open circuit. An error indicator/message may then be generated, and the system check may be repeated.

In a third system test, current is initially supplied through the bypass circuit 138. If operating properly, the current monitor 140-A and the T/S circuit 126 will detect the current and then switch off the bypass PEM 120. If the bypass PEM 120 is not shut off, or no current is detected, an error indicator/message may then be generated, and the system check may be repeated. If the first, second, and third system tests are satisfied, the bypass PEM 120 may be determined as healthy and operating properly.

Next, the following test sequence may be used to determine the health of the first and second PEMs 112, 114. One system test includes initially passing current through the bypass circuit 138, and then injecting current into the first PEM 112. If operating properly, the current monitor 140-B and the T/S circuit 126 will detect the current and then switch off the first PEM 112. If the first PEM 112 is not shut off, or no current is detected, an error indicator/message may then be generated, and the system check may be repeated.

Similarly, the second PEM 114 may be tested by initially passing current through the bypass circuit 138, and then injecting current into the second PEM 114. If operating properly, the current monitor 140-B and the T/S circuit 126 will detect the current and then switch off the second PEM 114. If the second PEM 114 is not shut off, or no current is detected, an error indicator/message may then be generated, and the system check may be repeated. If these system tests are satisfied, the first and second PEMs 112 and 114 may be determined as healthy and operating properly.

Figure 2:
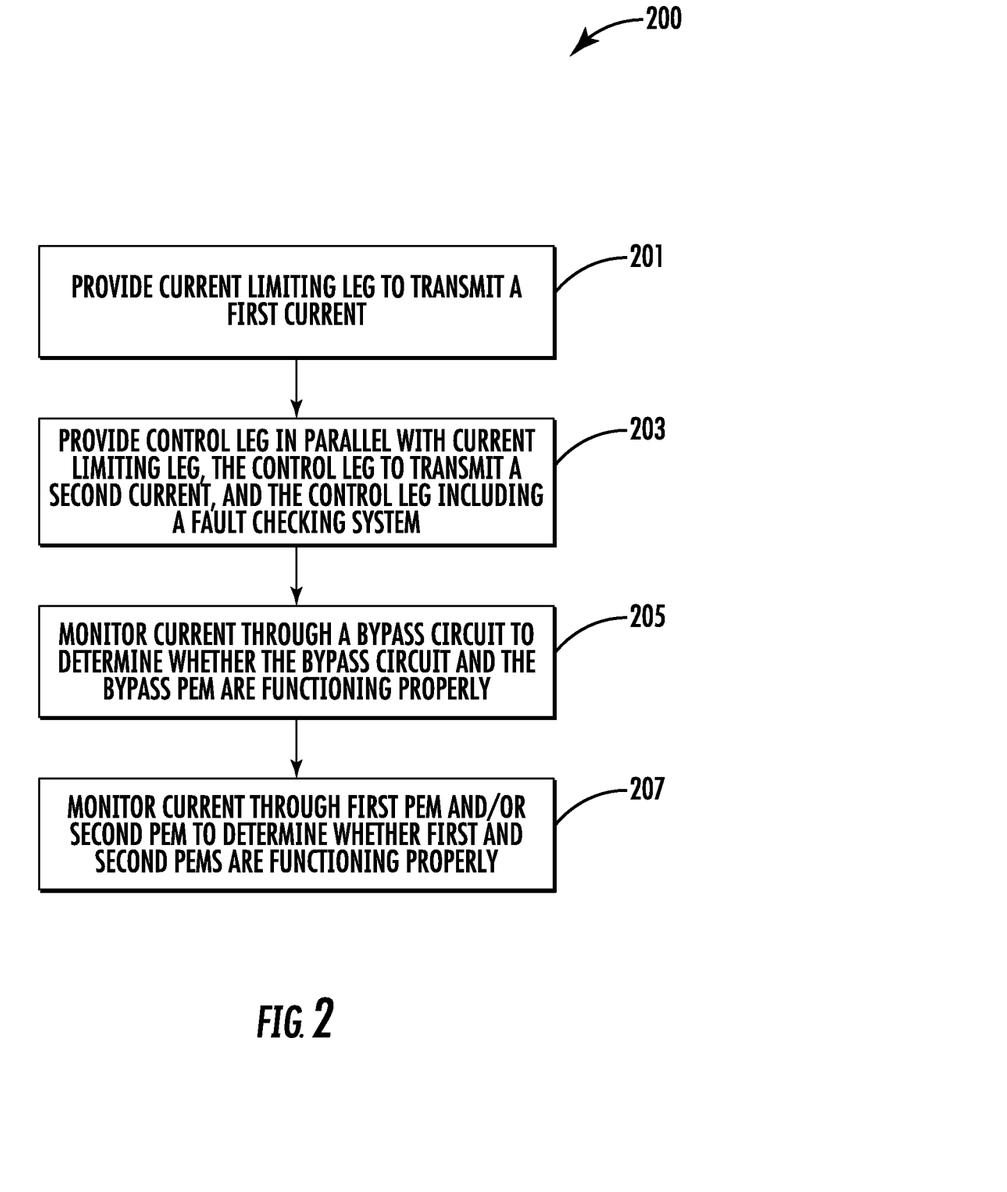
FIG. 2 presents an exemplary process flow according to additional embodiments of the disclosure.

FIG. 2 presents an exemplary process flow 200 according to embodiments of the disclosure. As shown, the process flow 200 may include providing a current limiting leg to transmit a first current, as shown at block 201. The process flow 200 may include providing a control leg in parallel with the current limiting leg, the control leg to transmit a second current, and the control leg including a fault checking system, as shown at block 203. The process flow 200 may further include monitoring current through a bypass circuit to determine whether the bypass circuit and the bypass PEM are functioning properly, as shown at block 205. The process flow 200 may further include monitoring current through at least one of the first PEM and the second PEM to determine whether the first and/or second PEMs are functioning properly, as shown at block 207.

Figure 3:
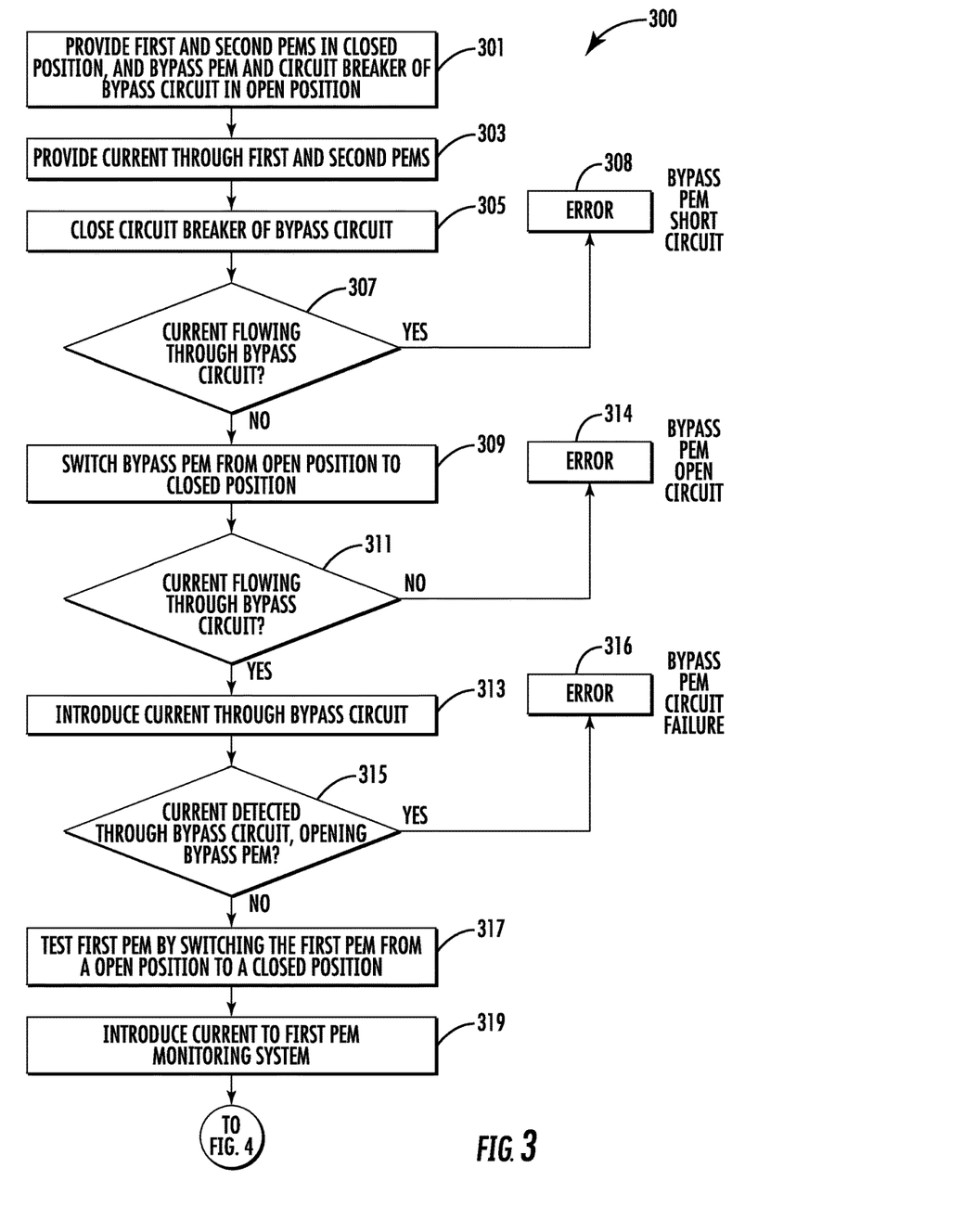
FIGS. 3-4 present an exemplary process flow according to additional embodiments of the disclosure.
Figure 4:
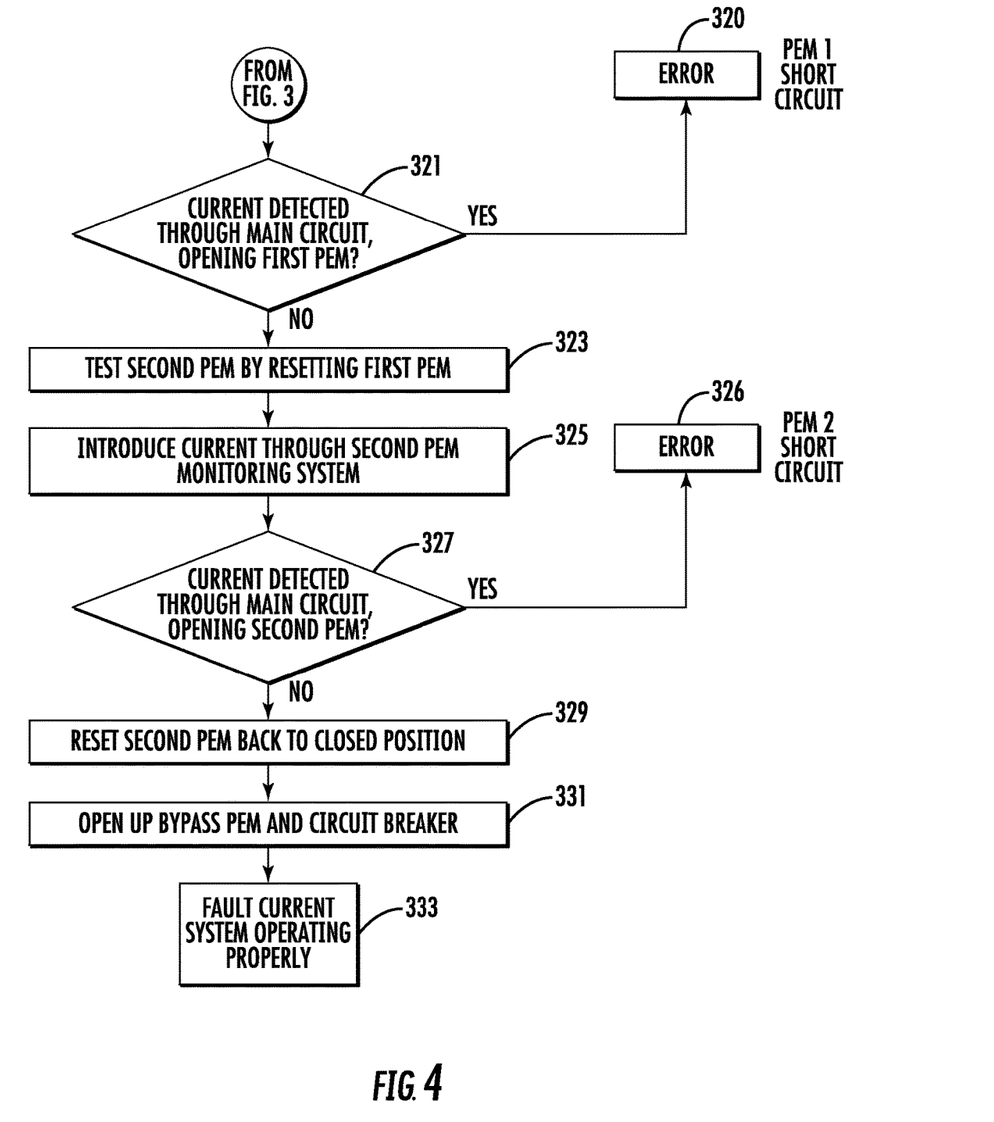

FIGS. 3-4 present an exemplary process flow 300 for determining whether a fault checking system, such as the fault checking system 110 of FIG. 1, is functioning properly. As shown, the process flow 300 includes providing the first power electronic module and the second power electronic module in a closed position, and providing the bypass power electronic module and a circuit breaker of the bypass circuit in an open position, as shown at block 301. The process flow 300 further includes providing a current through the first power electronic module and the second power electronic module, as shown at block 303. The process flow 300 further includes closing a circuit breaker of the bypass circuit, as shown at block 305, and detecting whether current is flowing through the bypass circuit after closing the circuit breaker, as shown at block 307. If YES, the process flow 300 continues to block 309. If NO, the process flow 300 generates an error message at block 308 indicating the bypass PEM has failed to short circuit and the process flow 300 ends.

The process flow 300 may further include switching the bypass PEM from the open position to a closed position, as shown at block 309. The process flow 300 further includes determining whether current is flowing through the bypass circuit after closing the circuit breaker, as shown at block 311. If YES, the process flow 300 continues to block 313. If NO, the process generates an error message, as shown at block 312, indicating the bypass PEM has failed to open circuit, and the process flow 300 then ends.

Next, the process flow 300 may include introducing current through the bypass circuit monitoring system, as shown at block 313, and determining whether the first current monitor detects the current supplied through the bypass circuit and opens the bypass PEM, stopping the current flowing, as shown at block 315. If NO, current is not flowing in the bypass circuit, the process flow 300 continues to block 317. If YES, current is flowing in the bypass circuit, the process generates an error message at block 316 indicating the bypass trigger circuit has failed, and the process flow 300 then ends.

Next, the process flow 300 determines whether the first PEM is functioning properly by switching the first PEM from a closed position to an open position to provide a route for current through the bypass circuit, as shown at block 317, and by introducing current to the first PEM circuit monitoring system, as shown at block 319. The process flow 300 then determines whether the first current monitor detects the current supplied through the main circuit and opens the first PEM, as shown at block 321, stopping the current flowing. If NO, current is not flowing in the main circuit (e.g., the connection including the first and second PEMs, excluding the bypass circuit), the process flow 300 continues to block 323. If YES, current is flowing in the main circuit, the process flow 300 generates an error message at block 320 indicating the first PEM module or its trigger circuit has failed, and the process flow 300 ends.

Next, the process flow 300 determines whether the second PEM is functioning properly by resetting the first PEM to a closed position, as shown at block 323, and by introducing current to the second PEM circuit monitoring system, as shown at block 325. The process flow 300 then determines whether the first current monitor detects the current supplied through the main circuit and opens the second PEM, stopping the current flowing, as shown at block 327. If NO, current is not flowing in the main circuit, the process flow 300 continues to block 329. If YES, current is flowing in the main circuit, the process generates an error message at block 326 indicating the second PEM or its trigger circuit has failed.

Finally, the process flow 300 resets the second PEM back to its closed position, as shown at block 329, and opens up the bypass PEM and breaker, as shown at block 331. The message such as "Fault current system operating properly" is reported back to the testing system as shown at block 333, thus ending the test process.

In summary, various embodiments including redundant circuits for current transformers and cross triggering from the control boards provide a first advantage including a robust system to ensure a network is always protected, and provide a second advantage of a convenient means to monitor status of PEMs, including a bypass PEM of a bypass circuit, within a fault current limiter, and with minimal effect on operation of the fault current limiter.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A fault current limiter, comprising
a current limiting leg to transmit a first current;
a control leg in parallel with the current limiting leg, the control leg to transmit a second current, the control leg comprising:
   a plurality of power electronic modules arranged in electrical series with one another;
   a bypass power electronic module arranged electrically in parallel with the plurality of power electronic modules;
   a plurality of current monitors arranged electrically in series with the plurality of power electronic modules and the bypass power electronic module; and
   at least one triggering circuit, wherein the plurality of current monitors are electrically coupled to the at least one triggering circuit, and wherein the at least one triggering circuit is coupled to at least one of: the plurality of power electronic modules, and the bypass power electronic module.

2. The fault current limiter of claim 1, further comprising a circuit breaker arranged in electrical series with the bypass power electronic module along a bypass circuit.

3. The fault current limiter of claim 1, further comprising a testing and supervision (T/S) circuit electrically coupled to the plurality of power electronic modules and to the at least one triggering circuit.

4. The fault current limiter of claim 1, wherein the at least one triggering circuit comprises a first triggering circuit in communication with a first power electronic module of the plurality of power electronic modules, a second triggering circuit in communication with a second power electronic module of the plurality of power electronic modules, and a third triggering circuit in communication with the bypass power electronic module.

5. The fault current limiter of claim 4, further comprising a first power supply powering the first power electronic module and the first triggering circuit, a second power supply powering the second power electronic module and the second triggering circuit, and a bypass power supply powering the bypass power electronic module and the third triggering circuit.

6. The fault current limiter of claim 1, wherein the plurality of power electronic modules and the bypass power electronic module comprise two or more insulated gate bipolar transistors.

7. The fault current limiter of claim 2, wherein a first current monitor of the plurality of current monitors is coupled to the control leg between the plurality of power electronic modules.

8. The fault current limiter of claim 7, wherein a second current monitor of the plurality of current monitors is coupled to the bypass circuit between the circuit breaker and the bypass power electronic module.

9. A fault current limiter, comprising
a current limiting leg to transmit a first current;
a control leg in parallel with the current limiting leg, the control leg to transmit a second current, the control leg including a fault checking system comprising:
   a first power electronic module and a second power electronic module arranged in electrical series with one another;
   a bypass power electronic module electrically in parallel with the first power electronic module and the second power electronic module;
   a plurality of current monitors arranged in electrical series with the first power electronic module, the second power electronic module, and the bypass power electronic module;
   a first triggering circuit in communication with the first power electronic module, a second triggering circuit in communication with the second power electronic module, and a third triggering circuit in communication with the bypass power electronic module; and
   a test and supervision (T/S) circuit electrically coupled to the first power electronic modules, the second power electronic module, and the bypass power electronic module, wherein the T/S circuit receives output from the plurality of current monitors for assessing operation of the first power electronic module, the second power electronic module, and the bypass power electronic module.

10. The fault current limiter of claim 9, further comprising:
a bypass circuit; and
a circuit breaker arranged in electrical series with the bypass power electronic module along the bypass circuit.

11. The fault current limiter of claim 9, wherein the T/S circuit is electrically coupled to the first triggering circuit, the second triggering circuit, and the third triggering circuit.

12. The fault current limiter of claim 9, further comprising a first power supply powering the first power electronic module and the first triggering circuit, a second power supply powering the second power electronic module and the second triggering circuit, and a bypass power supply powering the bypass power electronic module and the third triggering circuit.

13. The fault current limiter of claim 9, wherein the first power electronic module, the second power electronic module, and the bypass power electronic module comprise two or more insulated gate bipolar transistors.

14. The fault current limiter of claim 10, wherein a first current monitor of the plurality of current monitors is electrically coupled between the first power electronic module and the second power electronic module.

15. The fault current limiter of claim 14, wherein a second current monitor of the plurality of current monitors is coupled to the bypass circuit between the circuit breaker and the bypass power electronic module.

16. A method, comprising:
providing a current limiting leg to transmit a first current;
providing a control leg in parallel with the current limiting leg, the control leg to transmit a second current, the control leg including a fault checking system comprising:
   a first power electronic module and a second power electronic module arranged in electrical series with one another;
   a bypass power electronic module electrically in parallel with the first power electronic module and the second power electronic module;
   a plurality of current monitors arranged in electrical series with the first power electronic module, the second power electronic module, and the bypass power electronic module;
   a first triggering circuit in communication with the first power electronic module, a second triggering circuit in communication with the second power electronic module, and a third triggering circuit in communication with the bypass power electronic module;

monitoring current through a bypass circuit to determine whether the bypass circuit and the bypass power electronic module are functioning properly; and monitoring current through at least one of the first power electronic module and the second power electronic module to determine whether the at least one the first power electronic module and the second power electronic module is functioning properly.

17. The method of claim 16, further comprising determining whether the bypass circuit is functioning properly by:

providing the first power electronic module and the second power electronic module in a closed position, and providing the bypass power electronic module and a circuit breaker of the bypass circuit in an open position;

providing a current through the first power electronic module and the second power electronic module;

closing a circuit breaker of the bypass circuit;

detecting whether current is flowing through the bypass circuit after closing the circuit breaker; and generating an error indicator in the case no current is detected flowing through the bypass circuit after closing the circuit breaker.

18. The method of claim 17, further comprising determining whether the bypass power electronic module is functioning properly by:

switching the bypass power electronic module from the open position to a closed position;

determining whether current is flowing through the bypass circuit after closing the circuit breaker; and generating an error indicator in the case no current is detected flowing through the bypass circuit after closing the circuit breaker.

19. The method of claim 18, further comprising:

introducing current through the bypass circuit;

determine whether a first current monitor of the plurality of current monitors detects the current supplied through the bypass circuit; and generating an error indicator in the case the first current monitor of the plurality of current monitors does not detect the current supplied through the bypass circuit.

20. The method of claim 16, further comprising determining whether the first and second power electronic modules are functioning properly by:

providing current through the bypass circuit;

introducing current to the first power electronic module;

switching the first power electronic module from a closed position to an open position by a test and supervision (T/S) circuit in response to the current introduced to the first power electronic module;

introducing current to the second power electronic module;

switching the second power electronic module from a closed position to an open position by the T/S circuit in response to the current introduced to the second power electronic module; and generating an error message in the case the T/S circuit fails to switch either of the first power electronic module or the second power electronic module from the closed position to the open position.

* * * * *